(12) United States Patent
Draxelmayr

(10) Patent No.: US 10,187,052 B2
(45) Date of Patent: Jan. 22, 2019

(54) DEVICE AND METHOD FOR INTERNAL RESET SIGNAL GENERATION

(71) Applicant: Infineon Technologies AG, Neubiberg (DE)

(72) Inventor: Dieter Draxelmayr, Villach (AT)

(73) Assignee: Infineon Technologies AG, Neubiberg (DE)

( * ) Notice: Subject to any disclaimer, the term of this patent is extended or adjusted under 35 U.S.C. 154(b) by 33 days.

(21) Appl. No.: 15/409,364

(22) Filed: Jan. 18, 2017

(65) Prior Publication Data

US 2017/0237426 A1 Aug. 17, 2017

(30) Foreign Application Priority Data

Feb. 16, 2016 (DE) .................. 10 2016 102 696

(51) Int. Cl.
| | |
|---|---|
| *H03K 17/22* | (2006.01) |
| *H03K 3/037* | (2006.01) |
| *H03K 19/177* | (2006.01) |
| *H03K 19/20* | (2006.01) |
| *G06F 1/24* | (2006.01) |

(52) U.S. Cl.
CPC ......... *H03K 17/223* (2013.01); *H03K 3/0375* (2013.01); *H03K 17/22* (2013.01); *H03K 19/1774* (2013.01); *H03K 19/20* (2013.01); *G06F 1/24* (2013.01)

(58) Field of Classification Search
None
See application file for complete search history.

(56) References Cited

U.S. PATENT DOCUMENTS

| | | | | |
|---|---|---|---|---|
| 8,760,188 B2* | 6/2014 | Gondi | .................. | H04L 25/028 |
| | | | | 326/30 |
| 9,071,243 B2* | 6/2015 | Gondi | .............. | H03K 19/01855 |
| 9,306,563 B2* | 4/2016 | Gondi | .................. | H03K 19/00 |
| 2006/0164136 A1 | 7/2006 | Shin | | |
| 2008/0048743 A1* | 2/2008 | Seo | .......... | G06F 1/24 |
| | | | | 327/198 |
| 2008/0111605 A1* | 5/2008 | Yoshikawa | ............ | H03K 17/22 |
| | | | | 327/198 |
| 2012/0286687 A1 | 11/2012 | Kikuchi et al. | | |
| 2013/0088931 A1* | 4/2013 | Braceras | .................. | G11C 7/20 |
| | | | | 365/203 |
| 2013/0214846 A1* | 8/2013 | Uchiki | ................. | H03K 17/687 |
| | | | | 327/434 |
| 2015/0378385 A1* | 12/2015 | Rana | ........................ | G05F 3/16 |
| | | | | 327/143 |

(Continued)

FOREIGN PATENT DOCUMENTS

WO 86/05933 A1 10/1986

OTHER PUBLICATIONS

Office Action, in the German language, from counterpart German Application No. 102016102696.4, dated Nov. 22, 2016, 5 pp.

*Primary Examiner* — Lincoln Donovan
*Assistant Examiner* — Khareem E Almo
(74) *Attorney, Agent, or Firm* — Shumaker & Sieffert, P.A.

(57) ABSTRACT

Devices and methods for generating an internal reset signal are explained. A first circuit (11) generates a first reset signal (r1), and a second circuit (12) generates a second reset signal (r2). The first reset signal (r1) and the second reset signal (r2) are linked to form a reset signal (r) with which a further circuit part (14) can be reset.

20 Claims, 3 Drawing Sheets

(56) References Cited

U.S. PATENT DOCUMENTS

2016/0054361 A1\* 2/2016 Lee .................. G11C 5/148
 365/185.11
2017/0237426 A1\* 8/2017 Draxelmayr ......... H03K 3/0375
 327/143

\* cited by examiner

DEVICE AND METHOD FOR INTERNAL RESET SIGNAL GENERATION

TECHNICAL FIELD

The present application relates to devices and methods for internal reset signal generation.

BACKGROUND

Different types of circuits, for example sequential logic circuits, typically require what is normally referred to as a power-on reset in order to correctly begin their operation. The circuit is switched, in particular, to a defined state by means of a reset of this type. Without a reset of this type, circuits of this type may, for example, assume an undefined, for example random, state during power-on, which could result in an undefined operation.

Many commercially available integrated circuits therefore have a reset pin to which a reset signal can be applied by a user or under the control of other circuits in order to switch the integrated circuit to a defined state of this type. However, it is increasingly necessary for a circuit to power on in a defined manner even without an external reset signal. Internal reset signal generation circuits within the integrated circuit can be used for this purpose. These circuits typically respond to an event, such as an activation of a supply voltage, by outputting a defined signal as a reset signal. One example of a circuit of this type is known from U.S. Pat. No. 6,107,847 A. In the context of this application, circuits of this type are also referred to as POR ("Power On Reset") circuits.

However, an internal reset signal generation circuit of this type is comparatively difficult to check and test. Even if, for example, the internal reset signal generation circuit has a fault, the circuit may nevertheless power on ("randomly") in a defined state. Moreover, even if an internal reset signal is correctly generated when the circuit is tested, it may occur that no reset signal of this type is generated under certain operating conditions, which in turn may sometimes then result in an undefined power-on of the circuit. Faults of this type may thus be difficult to detect, and it may be difficult, in particular, to identify corresponding circuits as defective in which the internal reset generation does not operate correctly under all conditions. This is disadvantageous, particularly for safety-critical applications. For safety-critical applications of this type, is often necessary at least to be able to clearly detect when a circuit is not operating correctly, wherein the probability of an incorrect operation should preferably be as low as possible.

One object of the present application is therefore to provide devices and methods which are improved in this respect.

SUMMARY

A device as claimed in claim 1 and a method as claimed in claim 11 are provided. The subclaims define further example embodiments and an integrated circuit with a device of this type.

DETAILED DESCRIPTION

Different example embodiments are explained in detail below with reference to the attached drawings. These example embodiments serve merely as illustrations and are not to be interpreted as limiting. For example, a description of one example embodiment with a multiplicity of elements or features is not to be interpreted in such a way that all of these elements or features are necessary for the implementation. Moreover, other example embodiments may have fewer features or elements, or alternative features or elements. Furthermore, other features or elements which are not presented and described can also be provided in addition to the presented features or elements, for example components conventionally used in reset circuits or integrated circuits.

Features or elements of different example embodiments can be combined with one another, unless otherwise indicated. Variations and modifications which are described for one of the example embodiments may also be applicable to other example embodiments.

Connections between blocks, elements or components which are shown in the figures or are described here may be direct connections, i.e. connections without additional intermediate elements (for example metal conductors) or indirect connections, i.e. connections with one or more additional intermediate elements, provided that the essential function of the connection, for example to transmit a specific type of information, a specific signal or a specific control command, is not fundamentally modified.

In different example embodiments, two separate circuits are used for the internal reset generation and their results are linked. A redundancy by means of which an error rate can be reduced is created through the provision of two separate circuits for the internal reset generation. A corresponding example embodiment is shown in FIG. 1.

Figure 1:
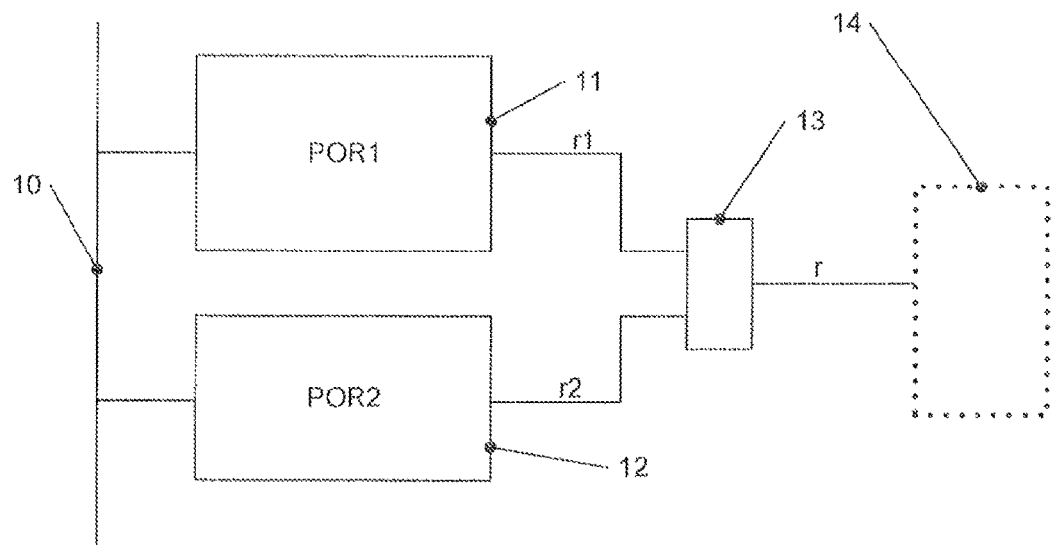
FIG. 1 is a block diagram of a device according to one example embodiment.

The example embodiment in FIG. 1 shows schematically a circuit for generating a reset signal r. The circuit shown in FIG. 1 may, in particular, form part of an integrated circuit and may supply other parts of the integrated circuit, for example sequential logic circuits, with the reset signal r in order to switch the other circuit parts to a defined status, for example during a power-on of the integrated circuit. A further circuit of this type is denoted in FIG. 1 with the reference number 14.

For this purpose, the device shown in FIG. 1 comprises a first circuit 11 for generating an internal reset signal r1 (referred to below as the first POR ("Power On Reset") circuit 11 and a second POR circuit 12 for generating a second reset signal r2. The first POR circuit 11 and the second POR circuit 12 are connected independently from one another to a line 10 on which an event occurs which indicates a power-on of the circuit, referred to below as a power-on event. For example, the line 10 may be a positive supply voltage line, in which case the power-on event would be e.g. an activation of the supply voltage. In another case, the power-on event may also be e.g. a renewed increase in the supply voltage following a voltage dip. The first POR circuit 11 and the second POR circuit 12 generate the first reset signal r1 and the second reset signal r2 in each case on the basis of the event on the line 10. The first POR circuit 11 and the second POR circuit 12 may be implemented in each case in their own right in a conventional manner, for example using a bandgap circuit, using comparators which compare the supply voltage 10 with an externally provided reference voltage, and/or using capacitors. A redundancy which reduces the probability of failure is created through the use of two POR circuits 11, 12.

The first POR circuit 11 and the second POR circuit 12 are preferably of different types. They may, for example, use different principles or modes of operation in order to generate the reset signals r1 and r2. This increases redundancy and reduces the risk of failure due to defective design, since different designs are used for the first and second POR circuit 11, 12. More than two POR circuits can also be used.

The reset signals r1, r2 are linked in a logic gate 13 to form the reset signal r. If a reset corresponds, for example, to a logical 1 of the signals r, r1, r2, the gate 13 may be an OR gate. If a reset corresponds to a logical 0 of the signals r, r1, r2, the gate 13 may be an AND gate. The logic gate 13 can thus be adapted to the levels of the reset signals r1, r2 output by the POR circuits 11, 12 and to the required levels for the reset signal r.

In one example embodiment, the first POR circuit 11 is an analog circuit, and the second POR circuit 12 is a digital circuit, e.g. a memory cell. In a further example embodiment, one of the two POR circuits, e.g. a digital circuit, generates a permanent reset during power-on and must first be controlled by the other POR circuit with a reset in order to end the reset and thus enable a further operation of the circuit. This enables the detection of faults in the other POR circuit, since a permanent reset is generated in the event of a failure of the other POR circuit.

An example of a circuit of this type will now be explained in detail with reference to FIGS. 2 and 3.

Figure 2:
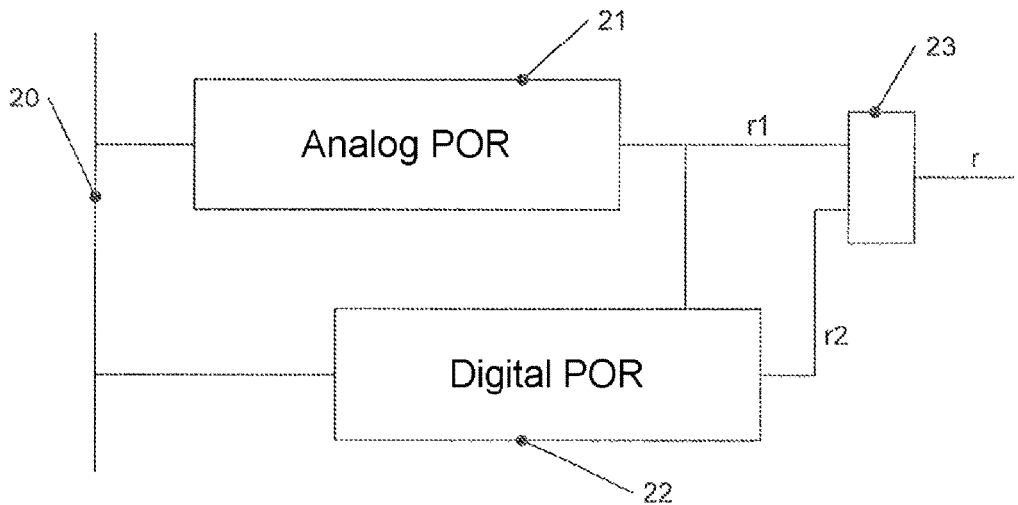
FIG. 2 is a block diagram of a device according to a further example embodiment.

In the example embodiment shown in FIG. 2, a device for internal reset generation comprises an analog POR circuit 21 and a digital POR circuit 22. The analog POR circuit 21 and the digital POR circuit 22 are connected to a supply voltage line 20 and generate a first reset signal r1 and a second reset signal r2 independently from a presence of voltage on the supply voltage line 20. The first reset signal r1 and the second reset signal r2 are linked by a logic gate 23 to form a reset signal r, wherein this may happen in the same way as described for the logic gate 13 shown in FIG. 1. The reset signal r can then reset other circuit parts during a power-on of a voltage supply on the supply voltage line 20. The supply voltage 20 is processed independently from the analog POR circuit 21 and the digital POR circuit 22 in order to form the first reset signal r1 and the second reset signal r2.

The digital POR circuit 22 is designed in such a way that it first generates a permanent reset as the second reset signal r2 during power-on (i.e. the signal r2 permanently indicates a reset).

For this purpose, the digital POR circuit 22 may be implemented, for example, as an asymmetric memory cell. An asymmetric memory cell of this type may correspond, for example, to memory cells which are contained in a downstream logic circuit, e.g. the further circuit 14 shown in FIG. 1, but may have a greater symmetry. Due to the asymmetry, the asymmetric memory cell assumes a defined state during a power-on event, particularly in cases where the state of the memory cells of the downstream logic circuit would be undefined without a reset (e.g. in the event of a voltage dip with a subsequent renewed increase in the supply voltage. A specific example of an implementation of this will be further explained later with reference to FIG. 3.

If the analog POR circuit 21 is operating correctly, it generates the reset signal r1 for a certain time period in such a way that the reset signal r1 indicates a reset. The reset signal r1 then acts on the digital POR circuit 22 also in order to end the reset signal r2 output by it (i.e. to set it to a value which no longer indicates a reset), so that, following the ending of the reset by the analog POR circuit 21, a reset is no longer indicated on the whole by the reset signal r. A circuit to which the reset signal r is fed can therefore begin to operate correctly after the ending of the reset. The analog POR circuit can be implemented here in a conventional manner.

If the analog POR circuit 21 fails, a permanent reset is present due to the digital POR circuit 22, this being relatively easy to detect. If the digital POR circuit 22 fails, a correct reset signal is still generated by the analog POR circuit 21. The device shown in FIG. 2 thus provides a redundancy on the one hand, and, on the other hand, enables a better fault detection for the analog POR circuit 21.

Figure 3:
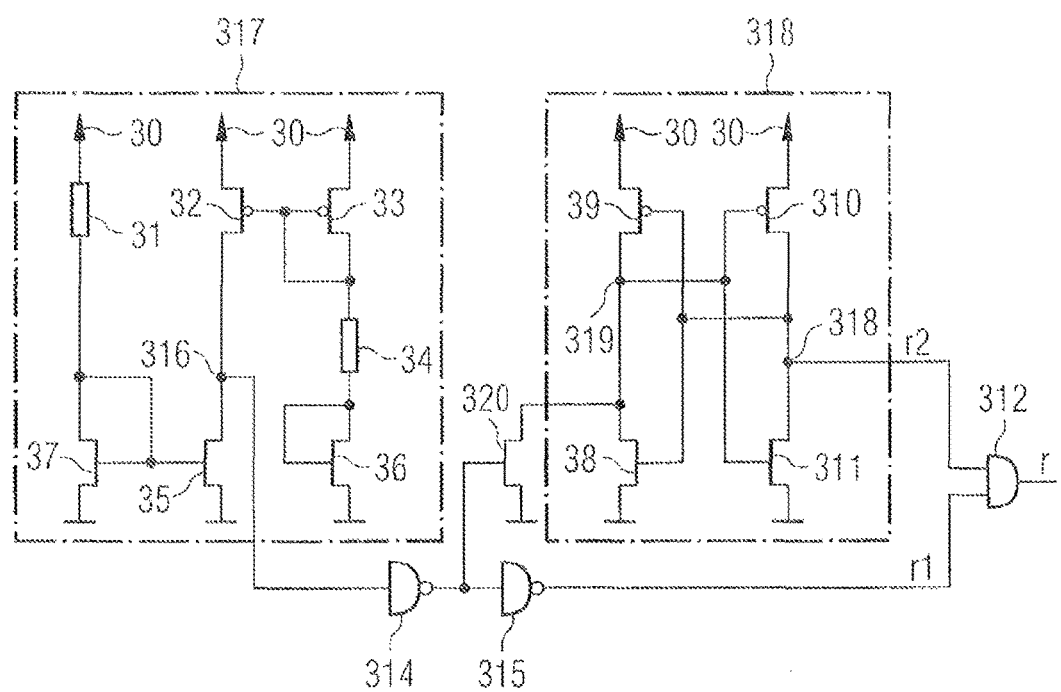
FIG. 3 is a circuit diagram of an example of an implementation of the device shown in FIG. 2.

FIG. 3 shows an example of an implementation for the example embodiment shown in FIG. 2. The example of an implementation shown in FIG. 3 serves merely for further illustration, other variants of the individual circuit parts also being possible.

In the example embodiment shown in FIG. 3, an example of an implementation of the analog POR circuit 21 is generally denoted by 317 and an example of an implementation of the digital POR circuit 22 is denoted by 318. The reference number 30 denotes a positive supply voltage which is an example of the supply voltage 20 shown in FIG. 2.

The logic shown in FIG. 3 is designed in such a way that a level of 0 of a reset signal r indicates a reset, whereas a level of 1 (corresponding to the supply voltage) indicates no reset.

The analog POR circuit 317 essentially comprises three branches which are connected between the supply voltage 30 and ground. A first branch comprises a resistor 31 and a transistor 37 (in the example shown an NMOS transistor), a second branch comprises a transistor 32 (in the example shown a PMOS transistor), an output node 316 and a transistor 35 (in the example shown an NMOS transistor), and a third branch comprises a transistor 33 (in this case a PMOS transistor), a resistor 34 and a transistor 36 (in the example shown an NMOS transistor). The transistor 37 is connected to the transistor 35 to form a first current mirror, and the transistor 32 is connected to the transistor 33 to form a second current mirror. The transistor 36 is connected as a diode.

As long as the positive supply voltage at 30 is less than the threshold voltages of the transistors, a low current at most flows.

If the voltage at 30 exceeds an NMOS diode threshold, the output node 316 is set to "low" via the NMOS transistors 37, 35 so that the signal r1 indicates a reset. If the voltage then exceeds around two diode thresholds, current flows in the right branch 33, 34, 36, as a result of which the node 316 is set to "high", i.e. the reset is ended. During power-on of the supply voltage 30, a reset signal r1 is generated at a low level for a certain time (while the voltage is between one diode threshold and two diode thresholds), said reset signal then being ended once more.

The analog POR circuit 317 as shown in FIG. 3 serves merely as an example, and further elements, for example cascode circuits, an addition of hysteresis, auxiliary resistors, transistors or capacitors, a Schmitt trigger or dummy elements can additionally be provided.

In the example of an implementation shown in FIG. 3, the POR circuit 318 is implemented in the form of a memory cell, in particular a latch, with two negative-feedback inverters. A first inverter is formed by a PMOS transistor 39 and an NMOS transistor 38, and a second inverter is formed by a PMOS transistor 310 and an NMOS transistor 311. The latch is designed as asymmetric. In particular, in the example embodiment shown, the transistor 311 is stronger than the transistor 38, and the transistor 39 is stronger than the transistor 310. In this context, "stronger" means that the transistor carries a higher current for a given operating point, which can be achieved through corresponding, different design of the transistors. This asymmetry results in an asymmetric behavior of the latch. In particular, as a result of the asymmetry, the second reset signal r2 which is present on an output node 318 is "low" (corresponding to ground) during power-on of the latch, whereas the signal on a corresponding inverted node 319 is "high" (corresponding to the supply voltage 30). A reset signal r2 which indicates a reset is therefore always output during power-on. As mentioned above, apart from the asymmetry, the latch may correspond to latches which are used in a downstream logic circuit (e.g. 14 in FIG. 1), e.g. in terms of the technology that is used, circuit structure, component design, etc.

If the analog POR circuit 317 and the digital POR circuit 318 are therefore both operating correctly, the analog POR circuit 317 generates a reset signal (r1 to "low") for a certain time, and the digital POR circuit would permanently generate a reset signal (r2 to "low") without further measures. However, due to the reset signal of the analog POR circuit 317, the digital POR circuit, i.e. the latch, is transferred via an inverter 314 and a control transistor 320, so that the output of the reset signal r2 is ended (i.e. the signal r2 then no longer indicates a reset). An inverter 315 then cancels out the effect of the inverter 314 on the signal r1.

In particular, a node is set to "low" via the transistor 320, thereby setting the node 318 to "high" and thus ending the reset r2.

However, if the analog POR circuit 317 fails, the digital POR circuit 318 is not transferred and permanently outputs a reset which is forwarded by an AND gate 312. In this case, a reset is permanently triggered, this being easily detectable as a fault from the outside. A malfunction of the analog POR circuit 317 can therefore be more reliably detected. If the digital POR circuit 318 fails, a reset signal is still generated correctly by the analog POR circuit 317.

Reliability can therefore be increased and/or fault detection can be simplified by means of the presented circuit.

In addition, the digital POR circuit 318 can also be modified, for example by means of additional capacitors which increase the asymmetry.

With regard to the modification options described, it is clear that the circuit shown in FIG. 3 represents only an example.

Figure 4:
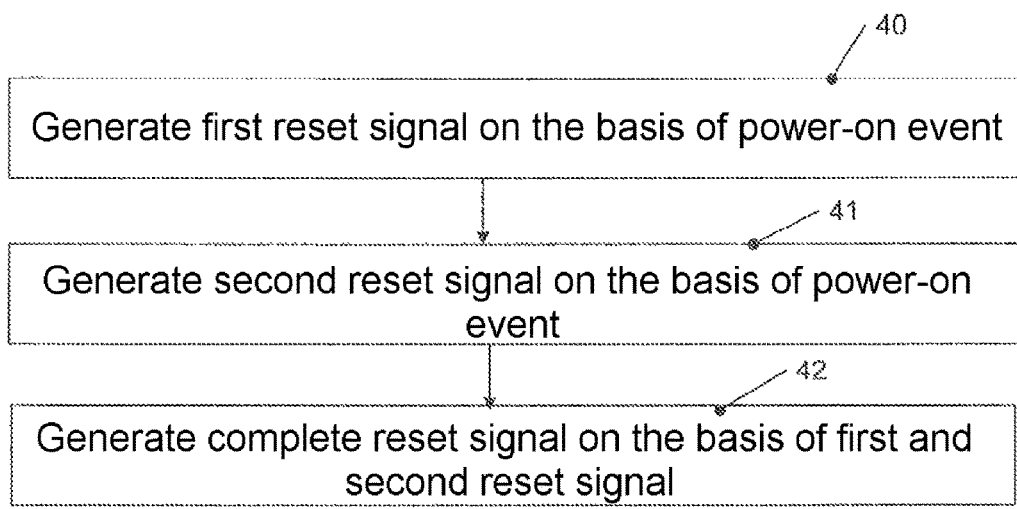
FIG. 4 is a flow diagram to illustrate a method according to one example embodiment.

FIG. 4 shows a flow diagram to illustrate a method according to one example embodiment. The method shown in FIG. 4 can be carried out, in particular, by means of the devices shown in FIG. 1-3, but also independently therefrom. Variations, modifications and additions which have been discussed in relation to the devices shown in FIG. 1-3, are applicable in corresponding form to the method shown in FIG. 4 also. Although the method shown in FIG. 4 is presented as a sequence of steps, the order of these steps should not be regarded as limiting. In particular, different steps can also be carried out simultaneously in different circuit parts.

In the example embodiment shown in FIG. 4, a first reset signal based on a power-on event, for example the power-on of a voltage on a supply voltage line, is generated at 40. A second reset signal based on the power-on event is generated independently therefrom at 41, for example by a different circuit part compared with the first power-on event. A complete reset signal based on the first reset signal and the second reset signal is generated, for example, by a logic gate which links the first reset signal to the second reset signal. Redundancy can be created through the use of two reset signals. Furthermore, as explained with reference to FIGS. 2 and 3, the first reset signal is used to cancel out the second reset signal in order to end the reset.

As already explained, the example embodiments discussed above serve merely for illustration, other implementations also being possible.

The invention claimed is:

1. A device for generating a complete reset signal, the device comprising:
    a first circuit comprising a first current mirror and a second current mirror, wherein the first circuit is configured to receive a supply voltage and generate a first internal reset signal on the basis of a power-on event of the supply voltage,
    wherein the first current mirror is configured to set the first internal reset signal to a state indicating reset when the supply voltage exceeds a first threshold, and
    wherein the second current mirror is configured to set the first internal reset signal to a state not indicating reset when the supply voltage exceeds a second threshold different than the first threshold;
    a second circuit configured to receive the supply voltage and generate a second internal reset signal on the basis of the power-on event, wherein the power-on event in the first circuit and the power-on event in the second circuit are used independently from one another in order to generate the first internal reset signal and the second internal reset signal; and
    a linking circuit to link the first internal reset signal and the second internal reset signal to form a complete reset signal.

2. The device of claim 1, wherein a type of the first circuit differs from a type of the second circuit.

3. The device of claim 2, wherein the first circuit comprises an analog circuit and the second circuit comprises a digital circuit.

4. The device of claim 2, wherein the second circuit comprises an asymmetric memory cell.

5. The device of claim 4, wherein the asymmetric memory cell comprises two negative-feedback inverters.

6. The device of claim 2, wherein the second circuit is configured to set the second internal reset signal on the basis of the first internal reset signal to the state not indicating reset.

7. The device of claim 1, wherein the power-on event comprises at least one of:
    an activation of the supply voltage;
    a renewed increase in the supply voltage; or
    an increase of a voltage of the supply voltage following a voltage dip.

8. The device of claim 1, wherein the first circuit further comprises:
    a first circuit branch between the supply voltage and ground, wherein the first circuit branch comprises a first resistor and a first transistor;
    a second circuit branch between the supply voltage and ground, wherein the second circuit branch comprises a second transistor, an output node and a third transistor, and wherein the first transistor and the third transistor form the first current mirror; and a third circuit branch between the supply voltage and ground, wherein the third circuit branch comprises a fourth transistor, and wherein the fourth transistor forms the second current mirror with the second transistor, a second resistor and a fifth transistor connected as a diode.

9. The device of claim 1, wherein the linking circuit comprises a logic gate configured to form the complete reset signal including the state indicating reset when the first internal reset signal includes the state indicating reset or when the second internal reset signal includes the state indicating reset.

10. An integrated circuit comprising:
a device for generating a complete reset signal, the device comprising:
  a first circuit comprising a first current mirror and a second current mirror, wherein the first circuit is configured to receive a supply voltage and generate a first internal reset signal on the basis of a power-on event of the supply voltage,
    wherein the first current mirror is configured to set the first internal reset signal to a state indicating reset when the supply voltage exceeds a first threshold, and
    wherein the second current mirror is configured to set the first internal reset signal to a state not indicating reset when the supply voltage exceeds a second threshold different than the first threshold;
  a second circuit configured to receive the supply voltage and generate a second internal reset signal on the basis of the power-on event, wherein the power-on event in the first circuit and the power-on event in the second circuit are used independently from one another in order to generate the first internal reset signal and the second internal reset signal; and
  a linking circuit to link the first internal reset signal and the second internal reset signal to form the complete reset signal; and
a circuit part for receiving the complete reset signal from the device.

11. The integrated circuit of claim 10,
wherein the second circuit comprises an asymmetric memory cell, and
wherein the circuit part comprises a memory cell which is structured according to the assymetric memory cell of the device, but has a lesser asymmetry.

12. A method comprising:
receiving a supply voltage;
generating a first reset signal on the basis of a power-on event of the supply voltage at least in part by:
  setting, through a first current mirror, the first reset signal to a state indicating reset when the supply voltage exceeds a first threshold and less than a second threshold, the second threshold being different than the first threshold; and
  setting, through a second current mirror, the first reset signal to a state not indicating reset when the supply voltage exceeds the second threshold;
generating a second reset signal on the basis of the power-on event, wherein the first reset signal is based on the power-on event independently from the second reset signal; and
linking of the first reset signal with the second reset signal to form a complete reset signal to be output.

13. The method of claim 12, further comprising the setting of the second reset signal to the state not indicating reset, on the basis of the first reset signal.

14. The method of claim 13, wherein the second reset signal continuously includes the state indicating reset provided that the first reset signal includes the state not indicating reset.

15. The method of claim 12, wherein the method is carried out by a device that comprises:
  a first circuit comprising the first current mirror and the second current mirror, wherein the first circuit is configured to receive the supply voltage and generate the first reset signal on the basis of the power-on event, and
  a second circuit configured to receive the supply voltage and generate the second reset signal on the basis of the power-on event, wherein the power-on event in the first circuit and the power-on event in the second circuit are used independently from one another in order to generate the first internal reset signal and the second internal reset signal, and
  a linking circuit to link the first internal reset signal and the second internal reset signal to form a complete reset signal.

16. The integrated circuit of claim 10, wherein the first circuit comprises:
  a first circuit branch between the supply voltage and ground, wherein the first circuit branch comprises a first resistor and a first transistor;
  a second circuit branch between the supply voltage and ground, wherein the second circuit branch comprises a second transistor, an output node and a third transistor, and wherein the first transistor and the third transistor form the first current mirror; and
  a third circuit branch between the supply voltage and ground, wherein the third circuit branch comprises a fourth transistor, and wherein the fourth transistor forms the second current mirror with the second transistor, a second resistor and a fifth transistor connected as a diode.

17. The integrated circuit of claim 11, wherein the assymetric memory cell comprises two negative-feedback inverters.

18. The device of claim 1,
wherein the second circuit is configured to set the second internal reset signal to the state not indicating reset when the first internal reset signal includes the state indicating reset, and
wherein the linking circuit is configured to form the complete reset signal including the state indicating reset when the first internal reset signal includes the state indicating reset or when the second internal reset signal includes the state indicating reset.

19. The device of claim 8,
wherein the first threshold comprises a diode threshold of the first transistor, and
wherein the second threshold comprises a diode threshold of the fourth transistor and a diode threshold of the fifth transistor.

20. The integrated circuit of claim 16,
wherein the first threshold comprises a diode threshold of the first transistor, and
wherein the second threshold comprises a diode threshold of the fourth transistor and a diode threshold of the fifth transistor.

* * * * *